(12) United States Patent
Yang

(10) Patent No.: US 8,159,066 B2
(45) Date of Patent: Apr. 17, 2012

(54) SEMICONDUCTOR PACKAGE HAVING A HEAT DISSIPATION MEMBER

(75) Inventor: Seung Taek Yang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 173 days.

(21) Appl. No.: 12/639,211

(22) Filed: Dec. 16, 2009

(65) Prior Publication Data

US 2011/0031613 A1    Feb. 10, 2011

(30) Foreign Application Priority Data

Aug. 10, 2009   (KR) .................. 10-2009-0073505

(51) Int. Cl.
*H01L 23/14* (2006.01)

(52) U.S. Cl. ........ 257/717; 257/621; 257/706; 257/713; 257/714; 257/777; 257/E23.08; 257/E23.101; 257/E23.107; 257/E23.109; 257/E23.11; 257/E23.114

(58) Field of Classification Search .......... 257/621, 257/706, 713, 717, 774, 777, E23.08, E23.101, 257/E23.107, E23.109, E23.11, E23.114
See application file for complete search history.

(56) References Cited

U.S. PATENT DOCUMENTS

| | | | | |
|---|---|---|---|---|
| 6,278,181 B1 * | 8/2001 | Maley | ........................... | 257/712 |
| 6,486,549 B1 * | 11/2002 | Chiang | ........................... | 257/723 |
| 6,982,487 B2 * | 1/2006 | Kim et al. | ...................... | 257/774 |
| 7,214,615 B2 * | 5/2007 | Miyazawa | ........................... | 438/667 |
| 2005/0017338 A1 * | 1/2005 | Fukazawa | ...................... | 257/686 |
| 2007/0262441 A1 * | 11/2007 | Chen | ............................. | 257/706 |
| 2008/0054444 A1 * | 3/2008 | Tuttle | ............................ | 257/698 |

FOREIGN PATENT DOCUMENTS

| | | |
|---|---|---|
| JP | 2000-260933 A | 9/2000 |
| KR | 10-0842910 B1 | 1/2008 |
| KR | 1020090083779 A | 8/2009 |
| KR | 20-0197028 Y1 | 7/2010 |

* cited by examiner

*Primary Examiner* — Eugene Lee
*Assistant Examiner* — Peniel M Gumedzoe
(74) *Attorney, Agent, or Firm* — Ladas & Parry LLP

(57) ABSTRACT

A semiconductor package having a heat dissipation member capable of efficiently conveying excess heat away from semiconductor chips is presented. The semiconductor package includes a semiconductor chip, through-electrodes, and a heat dissipation member. The semiconductor chip has a first surface, a second surface facing away from the first surface, and bonding pads which are disposed on the first surface. The through-electrodes are electrically connected with the bonding pads and passing through the first and second surfaces of the semiconductor chip, and protrude outward from the second surface. The heat dissipation member faces the second surface of the semiconductor chip and is coupled to the through-electrodes.

17 Claims, 5 Drawing Sheets

SEMICONDUCTOR PACKAGE HAVING A HEAT DISSIPATION MEMBER

CROSS-REFERENCE TO RELATED APPLICATIONS

The present application claims priority to Korean patent application number 10-2009-0073505 filed on Aug. 10, 2009, which is incorporated herein by reference in its entirety.

BACKGROUND OF THE INVENTION

The present invention relates to a semiconductor package.

Recently, semiconductor chips and semiconductor packages having the semiconductor chips capable of storing and processing huge amounts of data have been developed.

As operation speeds have increased, large amount of heat is generated from the semiconductor chip. This heat generated from the semiconductor chip retards the operation speed of the semiconductor chip, whereupon the performance of the semiconductor chip deteriorates.

While heat dissipation members are disposed on the outer surface of a semiconductor package in order to disperse heat, problems still persist which are based on the increased volume of the semiconductor package.

Meanwhile, as the thickness of a semiconductor chip included in a semiconductor package becomes no greater than several to several tens micrometers, then the semiconductor packages can be bent without being broken. In this regard, because the semiconductor chip can now be elastically bent and returns to its original shape, it is difficult to realize a bent type semiconductor package.

BRIEF SUMMARY OF THE INVENTION

Embodiments of the present invention are directed to a semiconductor package that can quickly dissipate heat generated from a semiconductor chip and is suitable to being configured in a bent shape.

In one embodiment of the present invention, a semiconductor package comprises a semiconductor chip having a first surface, a second surface facing away from the first surface, and bonding pads which are disposed on the first surface; through-electrodes pass through the first and second surfaces of the semiconductor chip, electrically connected with the bonding pads, and protrude outward away from the second surface; and a heat dissipation member facing the second surface of the semiconductor chip and defined with through-holes coupled with the portion of the through-electrodes that protrudes outward from the second surface of the semiconductor chip.

The heat dissipation member may include a metal body; and an insulation layer formed on a surface of the metal body in order to electrically insulate the heat dissipation member away form the semiconductor chip and the through-electrodes.

The insulation layer may comprise any one of an oxide layer or an organic layer.

The metal body may comprise any one of aluminum and copper.

The insulation layer may comprise an oxide coating layer which is formed by oxidating the metal body.

The through-electrodes may be disposed at positions corresponding to the bonding pads and may be directly connected to the bonding pads.

A length of portions of the through-electrodes which protrude outward away from the second surface of the semiconductor chip may be substantially the same as the thickness of the heat dissipation member.

Ends of the through-electrodes may protrude outward away from the heat dissipation member.

The heat dissipation member may include a metal body that has pores which are created by sintering metal particles; and an insulation substance placed in the pores.

The heat dissipation member may include an insulation body defined with pores; and heat transfer elements placed in the pores.

The semiconductor package may further comprise a heat transfer adhesive member interposed between the heat dissipation member and the second surface and containing a heat transfer substance and an adhesive.

At least two semiconductor chips may be stacked, and the through-electrodes of the respective semiconductor chips may be electrically connected with each other.

The semiconductor package may further comprise a substrate in which the semiconductor chips mounted thereon, wherein the substrate may include connection members which are electrically connected with the through-electrodes.

The through-electrodes may include a portion which protrudes outward away from the first surface of the semiconductor chip.

The semiconductor package may further comprise an additional heat dissipation member disposed on the first surface of the semiconductor chip and defined with through-holes coupled with the portion of the through-electrodes that protrudes outward from the second surface of the semiconductor chip.

The additional heat dissipation member may comprise an additional metal body; and an additional insulation layer formed on a surface of the additional metal body to electrically insulate the additional metal body away from the semiconductor chip and the through-electrodes.

The additional insulation layer may comprise any one of an oxide layer or an organic layer.

The semiconductor chip and the heat dissipation member may have a bent shape.

DESCRIPTION OF SPECIFIC EMBODIMENTS

Hereafter, specific embodiments of the present invention will be described in detail with reference to the accompanying drawings.

It is understood herein that the drawings are not necessarily to scale and in some instances proportions may have been exaggerated in order to more clearly depict certain features of the invention.

Figure 1:
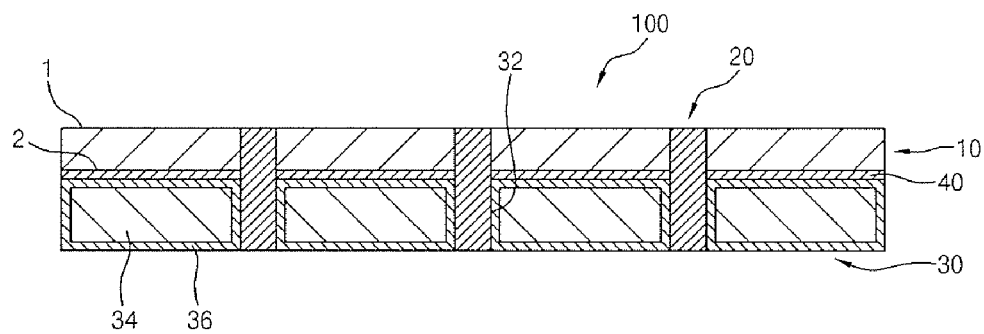
FIG. 1 is a cross-sectional view illustrating a semiconductor package in accordance with an embodiment of the present invention.
Figure 9:
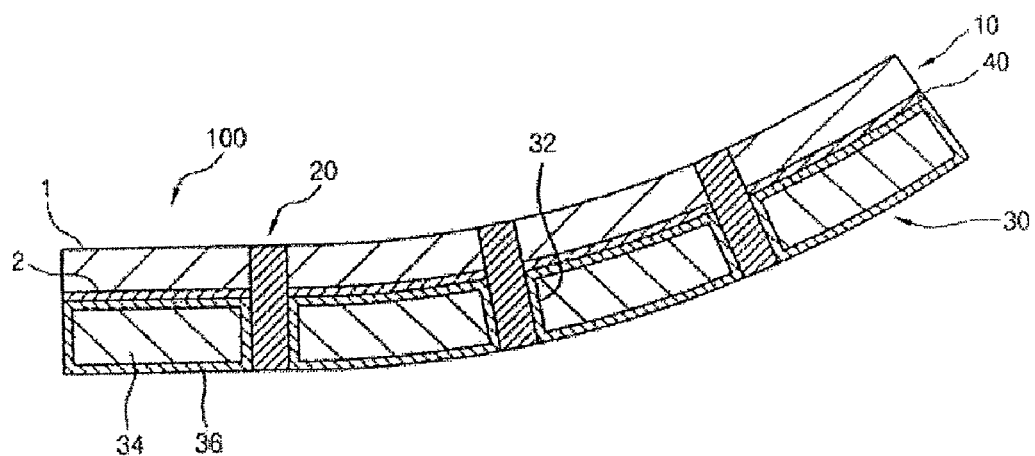
FIG. 9 is a cross-sectional view illustrating a semiconductor package in accordance with another embodiment of the present invention.

Referring to FIGS. 1 and 9 which depict cross-sectional views respectively illustrating linear or bent configurations of the semiconductor package in accordance with the present invention.

Referring to FIGS. 1 and 9, a semiconductor package 100 includes a semiconductor chip 10, through-electrodes 20, and a heat dissipation member 30.

For example, the semiconductor chip 10 possesses the shape of a rectangular hexahedral plate. The semiconductor chip 10 possessing the shape of a rectangular hexahedral plate has a first surface 1 and a second surface 2 which faces away from the first surface 1.

A circuit section (not shown) including a data storage unit (not shown) for storing data and a data processing unit (not shown) for processing data is disposed in the semiconductor chip 10.

The semiconductor chip 10 includes bonding pads (not shown) which are electrically connected with the circuit section.

The through-electrodes 20 pass through the first surface 1 and the second surface 2 of the semiconductor chip 10. The length of the through-electrodes 20 is greater than the thickness of the semiconductor chip 10, and due to this fact, the first ends of the through-electrodes 20 protrude from the second surface 2 by a predetermined length. In the embodiment, the first ends of the through-electrodes 20, which protrude from the second surface 2, have a length corresponding to the thickness of the heat dissipation member 30 which will be described later. Unlike this, the first ends of the through-electrodes 20 can have a length greater than the thickness of the heat dissipation member 30, and due to this fact, the first ends of the through-electrodes 20 can protrude from the heat dissipation member 30 by a preselected length.

In the embodiment, the through-electrodes 20 are electrically connected with the bonding pads (not shown) of the semiconductor chip 10 via wiring lines or redistribution lines which are disposed on the first surface 1 and/or the second surface 2 of the semiconductor chip 10.

Examples of materials capable of being used to form the through-electrodes 20 include copper and aluminum.

The heat dissipation member 30 is disposed on the second surface 2 of the semiconductor chip 10. The heat dissipation member 30 functions to quickly dissipate the heat generated from the semiconductor chip 10 or maintain the bent state of the semiconductor chip 10.

The heat dissipation member 30 has through-holes 32. The through-holes 32 are defined at positions that correspond to the through-electrodes 20 of the semiconductor chip 10.

In the embodiment, the heat dissipation member 30 includes a metal body 34 which quickly dissipates the heat generated from the semiconductor chip 10 to outside of the semiconductor chip 10. The heat dissipation member 30 also includes an electrical insulation layer 36 which electrically insulates the metal body 34 away from the semiconductor chip 10 while allowing heat to dissipate away from the semiconductor chip 10 through the insulation layer 36 to the outside.

The metal body 34 preferably has a plate shape which is relatively thin with respect to the thickness of the semiconductor chip 10. The through-holes 32 are defined through the metal body 34 at the positions that correspond to the through-electrodes 20. Examples of metals capable of being used to form the metal body 34 can include any number of thermally conductive metals such as copper and aluminum. In one preferred the embodiment, the metal body 34 may contain, for example, aluminum.

The insulation layer 36 covers over of the metal body 34 which includes the surfaces of the through-holes 32. The insulation layer 36 can comprise, for example, any one of an oxide layer, an organic layer, and an oxide coating layer which is formed by oxidating the metal body 34.

In one embodiment, when the metal body 34 contains, for example, aluminum, the insulation layer 36 can comprise an oxide coating layer such as an anodizing layer which is formed, for example, by oxidating aluminum.

In one embodiment, a heat transfer adhesive member 40 and an adhesive both of which conduct heat greater than the heat dissipation member 30 can be interposed between the semiconductor chip 10 and the heat dissipation member 30.

The heat transfer adhesive member 40 not only can be configured to directly physically connect onto the semiconductor chip 10 and onto the heat dissipation member 30, but the heat dissipation member 30 can also quickly transfer heat away from the semiconductor chip 10. Whereupon the operational characteristics of the semiconductor chip 10 can be improved.

Figure 2:
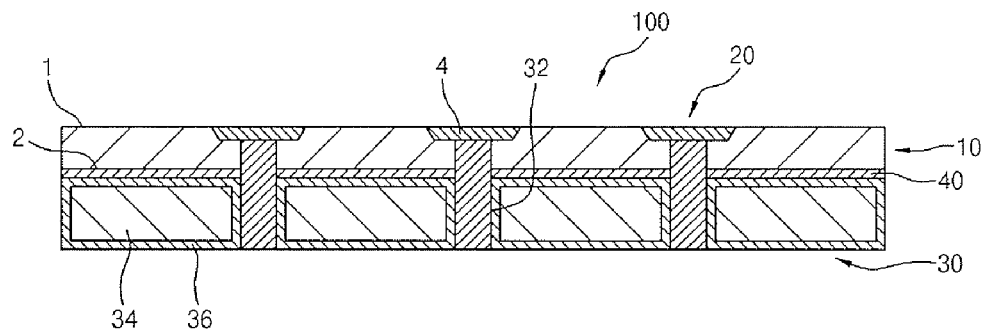
FIG. 2 is a cross-sectional view illustrating a semiconductor package in accordance with another embodiment of the present invention.

FIG. 2 is a cross-sectional view illustrating a semiconductor package in accordance with another embodiment of the present invention. The semiconductor package shown in FIG. 2 has substantially the same construction as the semiconductor package described above with reference to FIG. 1, except it has bonding pads. Therefore, description for the same component parts will be omitted herein, and the same technical terms and the same reference numerals will be used to refer to the same or like component parts.

Referring to FIG. 2, a semiconductor package 100 includes a semiconductor chip 10, through-electrodes 20 and a heat dissipation member 30. The semiconductor chip 10 includes bonding pads 4 which are electrically connected to a circuit section (not shown).

In the embodiment, the bonding pads 4 are disposed on a first surface 1 of the semiconductor chip 10. The through-electrodes 20 are disposed at positions corresponding to the bonding pads 4 such that the bonding pads 4 and the through-electrodes 20 are electrically connected to each other. In the embodiment, when the bonding pads 4 and the through-electrodes 20 are directly connected electrically to each other, redistribution lines for electrically connecting the bonding pads 4 and the through-electrodes 20 are not needed, whereby the manufacturing procedure of the semiconductor package can be simplified.

Figure 3:
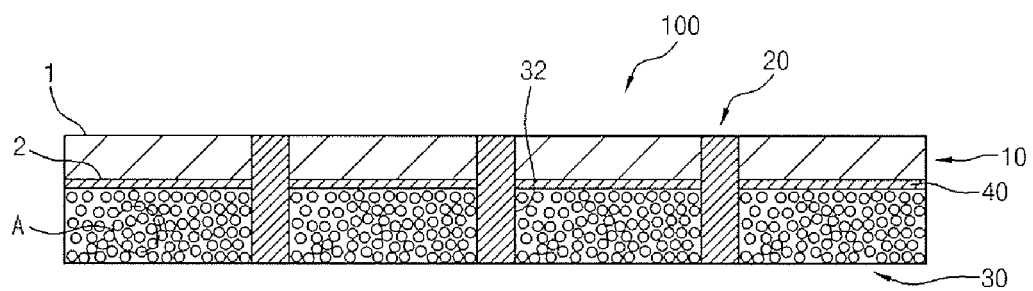
FIG. 3 is a cross-sectional view illustrating a semiconductor package in accordance with another embodiment of the present invention.
Figure 4:
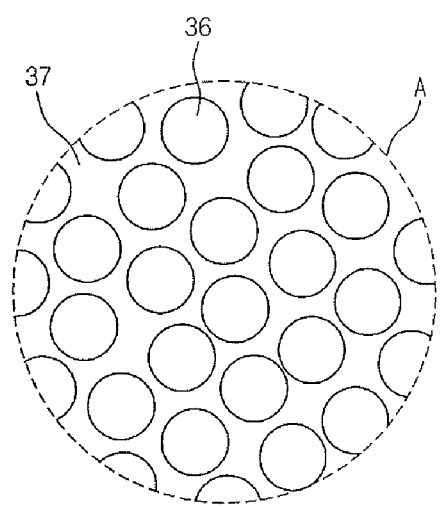
FIG. 4 is an enlargement view for the part "A" of FIG. 3.

FIG. 3 is a cross-sectional view illustrating a semiconductor package in accordance with yet another embodiment of the present invention. FIG. 4 is an enlargement view for the part "A" of FIG. 3. The semiconductor package shown in FIGS. 3 and 4 has substantially the same construction as the semiconductor package described above with reference to FIG. 1, except it has a heat dissipation member. Therefore, description for the same component parts will be omitted herein, and the same technical terms and the same reference numerals will be used to refer to the same or like component parts.

Referring to FIGS. 3 and 4, a semiconductor package 100 includes a semiconductor chip 10, through-electrodes 20, and a heat dissipation member 30.

The heat dissipation member 30 includes a metal body 36 and an electrical insulation substance 37. The metal body 36 includes a number of metal particles which are sintered with one another. The metal body 36 has pores due to the presence of the plurality of sintered metal particles.

The insulation substance 37 is placed in the pores of the metal body 36. The insulation substance 37 functions to electrically insulate the metal body 36 from the semiconductor chip 10 and to efficiently dissipate heat away from the semiconductor chip 10 to the outside.

In this embodiment, the heat dissipation member 30 containing the sintered metal particles and the insulation substance 37 is likely to be broken while when it is bent. Hence, in order to realize a semiconductor package having the bent heat dissipation member 30, it is preferred that the metal particles be sintered in the desired bent shape of the heat dissipation member 30.

In the embodiment, the insulation substance 37 placed in the metal body 36 can contain a heat transfer substance that has a thermal conductivity greater than that of the metal particles.

Figure 5:
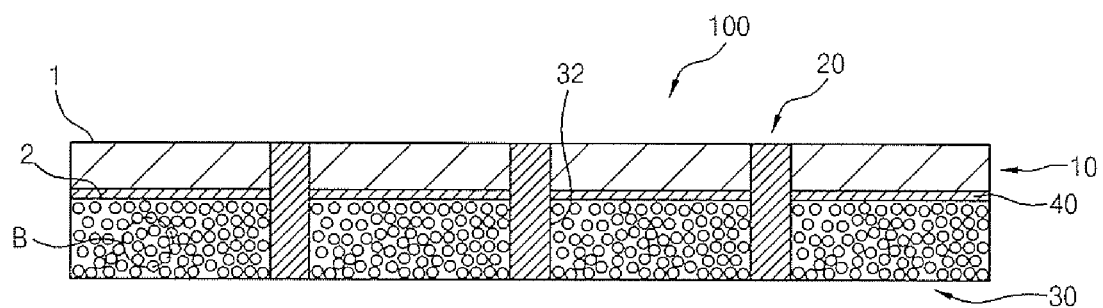
FIG. 5 is a cross-sectional view illustrating a semiconductor package in accordance with another embodiment of the present invention.
Figure 6:
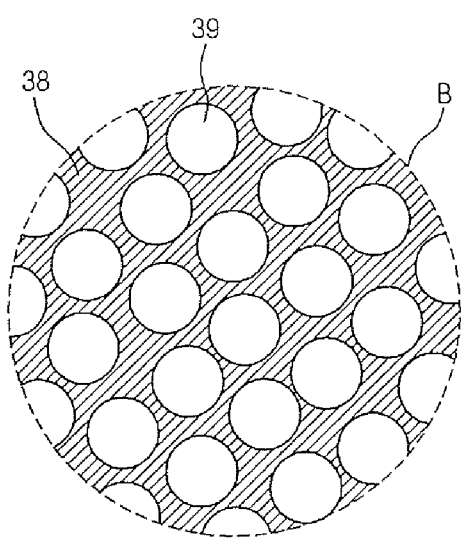
FIG. 6 is an enlargement view for the part "B" of FIG. 5.

FIG. 5 is a cross-sectional view illustrating a semiconductor package in accordance with another embodiment of the present invention. FIG. 6 is an enlargement view for the part "B" of FIG. 5. The semiconductor package shown in FIGS. 5 and 6 has substantially the same construction as the semiconductor package described above with reference to FIG. 1, except a heat dissipation member. Therefore, description for the same component parts will be omitted herein, and the same technical terms and the same reference numerals will be used to refer to the same or like component parts.

Referring to FIGS. 5 and 6, a semiconductor package 100 includes a semiconductor chip 10, through-electrodes 20, and a heat dissipation member 30.

The heat dissipation member 30 includes an electrically insulation body 38 and heat transfer elements 39.

The insulation body 38 has a plurality of pores, and the heat transfer elements 39 are placed in the insulation body 38. The heat generated from the semiconductor chip 10 is quickly transferred away from the semiconductor chip 10 through the heat transfer elements 39 placed in the insulation body 38. Whereupon the overall performance of the semiconductor package 100 can be significantly improved and a bent type semiconductor package can be manufactured by bending the insulation body 38.

Figure 7:
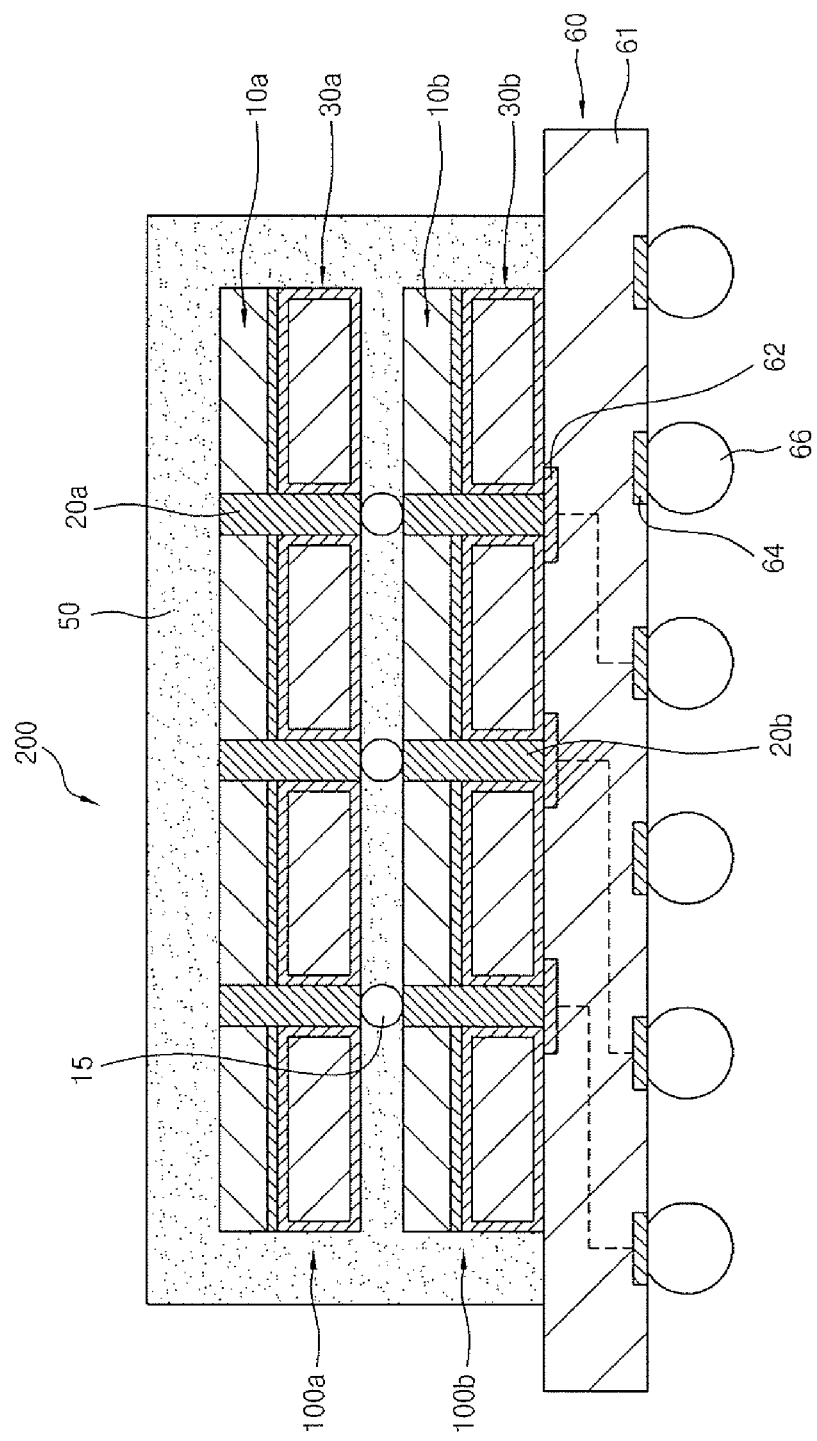
FIG. 7 is a cross-sectional view illustrating a semiconductor package in accordance with another embodiment of the present invention.

FIG. 7 is a cross-sectional view illustrating a semiconductor package in accordance with another embodiment of the present invention. The semiconductor package shown in FIG. 7 has substantially the same construction as the semiconductor package described above with reference to FIG. 1, except the number of semiconductor packages and a substrate. Therefore, description for the same component parts will be omitted herein, and the same technical terms and the same reference numerals will be used to refer to the same or like component parts.

Referring to FIG. 7, a semiconductor package 200 includes a first semiconductor package 100a, a second semiconductor package 100b, and a substrate 60.

The first semiconductor package 100a includes a semiconductor chip 10a, through-electrodes 20a and a heat dissipation member 30a.

The second semiconductor package 100b includes a semiconductor chip 10b, through-electrodes 20b and a heat dissipation member 30b.

The first semiconductor package 100a is disposed on the second semiconductor package 100b. The through-electrodes 20a and 20b of the first and second semiconductor packages 100a and 100b are aligned with each other at the same positions. One preferred configuration is that the semiconductor chips 10a and 20b and the heat dissipation members 30a and 30b are alternately arranged.

Conductive balls 15 such as solder balls can be placed between the through-electrodes 20a and 20b of the first and second semiconductor packages 100a and 100b. The through-electrodes 20a and 20b are electrically connected to each other by the conductive balls 15.

The substrate 60 includes a substrate body 61, connection pads 62, ball lands 64, and solder balls 66.

The connection pads 62 are disposed on the upper surface of the substrate body 61, and the ball lands 64 are disposed on the lower surface of the substrate body 61, facing away from the upper surface. The corresponding connection pads 62 and the ball lands 64 are electrically connected to each other through the substrate body 61. The solder balls 66 are placed on and are electrically connected to the ball lands 64.

The through-electrodes 20b of the second semiconductor package 100b are electrically connected to the connection pads 62. The molding member 50 molds together the first and second semiconductor packages 100a and 100b and the upper surface of the substrate 60.

Figure 8:
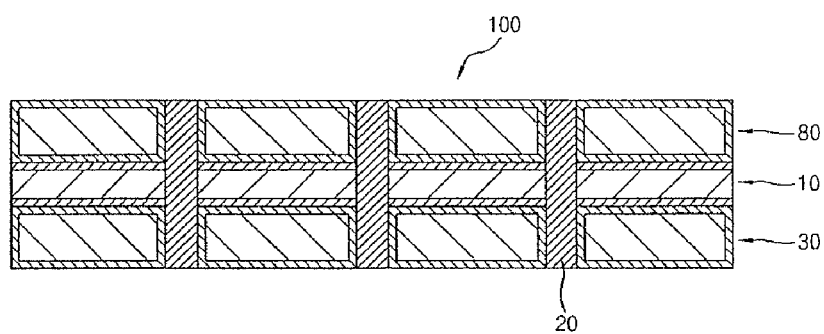
FIG. 8 is a cross-sectional view illustrating a semiconductor package in accordance with another embodiment of the present invention.

FIG. 8 is a cross-sectional view illustrating a semiconductor package in accordance with still yet another exemplary embodiment of the present invention. The semiconductor package shown in FIG. 8 has substantially the same construction as the semiconductor package described above with reference to FIG. 1, except it has an additional heat dissipation member. Therefore, description for the same component parts will be omitted herein, and the same technical terms and the same reference numerals will be used to refer to the same or like component parts.

Referring to FIG. 8, a semiconductor package 100 includes a semiconductor chip 10, through-electrodes 20, a heat dissipation member 30, and an additional heat dissipation member 80.

In the semiconductor package 100 shown in FIG. 1, the heat dissipation member 30 is disposed on the second surface 2 of the semiconductor chip 10. However, if the heat dissipation member 30 is disposed on the one surface of the semiconductor chip 10 of the semiconductor package 100 shown in FIG. 1, the semiconductor package 100 is likely to be warped due to a difference in thermal expansion coefficient between the semiconductor chip 10 and the heat dissipation member 30.

In this embodiment, in order to protect against warpage of the semiconductor package 100 due to the difference in thermal expansion coefficient between the semiconductor chip 10 and the heat dissipation member 30, the through-electrodes protrude outward away from the first surface of the semiconductor chip and the additional heat dissipation member 80 is disposed on the first surface 1 of the semiconductor chip 10, facing away from the second surface 2. The additional heat dissipation member 80 has substantially the same configuration as the heat dissipation member 30. That is, the additional heat dissipation member 80 may comprise an additional metal body and an additional insulation layer formed on a surface of the additional metal body to electrically insulate the additional metal body away from the semiconductor chip 10 and the through-electrodes 20. Also, the additional heat dissipation member 80 has through-holes coupled with the portion of the through-electrodes 20 that protrudes outward from the second surface 2 of the semiconductor chip 10.

As is apparent from the above description, in the present invention, a heat dissipation member is provided to a semiconductor package so that the heat generated in the semiconductor chip can be quickly dissipated away from the semiconductor chip to the outside, whereby the performance of the semiconductor package can be improved. Also, it is possible to manufacture a bent or flexed semiconductor package by bending the heat dissipation member.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
    a semiconductor chip having a first surface, a second surface facing away from the first surface, and bonding pads disposed on the first surface;
    through-electrodes passing through the semiconductor chip, the through-electrodes electrically connected with the bonding pads and protruding outward away from the second surface of the semiconductor chip;
    a heat dissipation member facing the second surface of the semiconductor chip and defined with through-holes coupled with a portion of the through-electrodes that protrudes outward away from the second surface of the semiconductor chip; and
    a heat transfer adhesive member interposed between the heat dissipation member and the second surface and containing a heat transfer substance and an adhesive.

2. The semiconductor package according to claim 1, wherein the heat dissipation member includes:
    a metal body; and
    an insulation layer formed on a surface of the metal body, the insulation layer electrically insulates the metal body away from the semiconductor chip and the through-electrodes.

3. The semiconductor package according to claim 2, wherein the insulation layer comprises any one of an oxide layer or an organic layer.

4. The semiconductor package according to claim 2, wherein the metal body comprises any one of aluminum and copper.

5. The semiconductor package according to claim 4, wherein the insulation layer comprises an oxide coating layer which is formed by oxidating the metal body.

6. The semiconductor package according to claim 1, wherein the through-electrodes are disposed at positions corresponding to the bonding pads and are directly connected to the bonding pads.

7. The semiconductor package according to claim 1, wherein a length of the portion of the through-electrodes that protrudes outward away from the second surface of the semiconductor chip is substantially the same as a thickness of the heat dissipation member.

8. The semiconductor package according to claim 1, wherein ends of the through-electrodes protrude outward and through the heat dissipation member.

9. The semiconductor package according to claim 1, wherein the heat dissipation member includes:
    a metal body having pores which are created by sintering metal particles; and
    an insulation substance placed in the pores.

10. The semiconductor package according to claim 1, wherein the heat dissipation member includes:
    an electrical insulation body having pores; and
    heat transfer elements placed in the pores.

11. The semiconductor package according to claim 1, wherein at least two semiconductor chips are stacked, and the through-electrodes of the respective semiconductor chips are electrically connected with each other.

12. The semiconductor package according to claim 11, further comprising:
    a substrate on which the semiconductor chips mounted thereon,
    wherein the substrate includes connection members which are electrically connected with the through-electrodes.

13. The semiconductor package according to claim 1, wherein the through-electrodes include a portion which protrudes outward away from the first surface of the semiconductor chip.

14. The semiconductor package according to claim 13, further comprising:
    an additional heat dissipation member disposed on the first surface of the semiconductor chip and defined with through-holes coupled with the portion of the through-electrodes that protrudes outward away form the first surface of the semiconductor chip.

15. The semiconductor package according to claim 14, wherein the additional heat dissipation member comprises:
    an additional metal body; and
    an additional insulation layer formed on a surface of the additional metal body, the additional insulation layer electrically insulates the additional metal body away from the semiconductor chip and away from the through-electrodes.

16. The semiconductor package according to claim 15, wherein the additional insulation layer comprises any one of an oxide layer or an organic layer.

17. The semiconductor package according to claim 1, wherein the semiconductor chip and the heat dissipation member have a bent shape.

* * * * *